United States Patent
Hu et al.

(10) Patent No.: US 11,252,749 B2
(45) Date of Patent: Feb. 15, 2022

(54) VIRTUAL RESOURCE UNIT FOR MULTI-RESOURCE UNIT ASSIGNMENT TO A SINGLE STATION IN WLAN

(71) Applicant: MediaTek Singapore Pte. Ltd., Singapore (SG)

(72) Inventors: Shengquan Hu, San Jose, CA (US); Jianhan Liu, San Jose, CA (US); Thomas Edward Pare, Jr., San Jose, CA (US)

(73) Assignee: Mediatek Singapore PTE. LTD., Singapore (SG)

( * ) Notice: Subject to any disclaimer, the term of this patent is extended or adjusted under 35 U.S.C. 154(b) by 49 days.

(21) Appl. No.: 16/880,764

(22) Filed: May 21, 2020

(65) Prior Publication Data

US 2020/0383133 A1    Dec. 3, 2020

Related U.S. Application Data

(60) Provisional application No. 62/856,251, filed on Jun. 3, 2019.

(51) Int. Cl.
*H04W 72/12* (2009.01)
*H04L 1/00* (2006.01)
*H04W 84/12* (2009.01)

(52) U.S. Cl.
CPC ......... *H04W 72/1273* (2013.01); *H04L 1/004* (2013.01); *H04W 84/12* (2013.01)

(58) Field of Classification Search
CPC ............. H04W 72/12; H04W 72/1205; H04W 72/1263; H04W 72/1273; H04W 84/12; H04L 1/004; H04L 1/0041
See application file for complete search history.

(56) References Cited

U.S. PATENT DOCUMENTS 10,826,649 B1 * 11/2020 Yu .................... H04L 1/0058
2018/0255570 A1    9/2018 Patil et al.
2019/0036642 A1    1/2019 Huang et al.
(Continued)

FOREIGN PATENT DOCUMENTS

CN        103339893          9/2016
EP        3403383 A1        11/2018
(Continued)

OTHER PUBLICATIONS

Working Group of LAN/MAN Standards Committee of the IEEE Computer Society. IEEE P802.11ax/D0.5 Draft Standard for Information technology—Telecommunications and information exchange between systems Local and metropolitan area networks—Specific requirements. Sep. 2016. 376 pp.

*Primary Examiner* — Kevin D Mew

(57) ABSTRACT

Embodiments of the present invention can assign multiple resource units (RUs) to a single wireless station using an aggregated Multi-RU ("virtual resource unit" or "vRU") that aggregates multiple RUs, and the parameters of the virtual RU can be calculated according to existing standards such the padding schemes and RUs (e.g., RU26, RU52, RU106, RU242, RU484, RU996, RU2x996) defined in IEEE 802.11ax. The virtual RU parameters used for joint encoding can be directly calculated based on formulas described herein according to embodiments of the present invention, and according to values obtained from pre-defined tables.

20 Claims, 15 Drawing Sheets

(56) References Cited

U.S. PATENT DOCUMENTS

| | | | |
|---|---|---|---|
| 2020/0052832 A1* | 2/2020 | Tian | H04L 1/1845 |
| 2020/0107325 A1* | 4/2020 | Zhang | H04L 25/03866 |
| 2020/0136764 A1* | 4/2020 | Zhang | H04L 1/0083 |
| 2021/0099248 A1* | 4/2021 | Hu | H04L 1/0071 |

FOREIGN PATENT DOCUMENTS

| | | |
|---|---|---|
| TW | 201722107 | 6/2017 |
| TW | I644553 | 12/2018 |
| WO | 2017075227 A1 | 5/2017 |

* cited by examiner

500

$$N_{Excess} = \text{mod}(8 \cdot \text{APEP\_LENGTH} + N_{Tail} + N_{service}, m_{STBC} \cdot \boxed{N_{DBPS}}) \quad (27\text{-}60)$$
$$\phantom{xxxxxxxxxxxxxxxxxxxxxxxxxxxxxxxxxxxxxxxxxxxxxxxxxxxxxxxxxxx}\swarrow vNdbps$$
$$\phantom{xxxxxxxxxxxxxxxxxxxxxxxxxxxxxxxxxxxxxxxxxxxxxxxxxxxxxxxxxxx}505$$

$$a_{init} = \begin{cases} 4, & \text{if } N_{Excess} = 0 \\ \min\left(\left\lceil \dfrac{N_{Excess}}{m_{STBC} \cdot N_{DBPS, SHORT}} \right\rceil, 4\right), & \text{otherwise} \end{cases} \quad (27\text{-}61)$$

$N_{DBPS, SHORT} = N_{CBPS, SHORT} \cdot R$, in which $R$ is the coding rate, and $N_{CBPS, SHORT} = \boxed{N_{SD, SHORT}} \cdot N_{SS} \cdot N_{BPSCS}$;
$\phantom{xxxxxxxxxxx}\searrow$ vNsd,short
$\phantom{xxxxxxxxxxxxx}$515

$$N_{DBPS, last, init} = \begin{cases} a_{init} N_{DBPS, SHORT}, & \text{if } a_{init} < 4 \\ \boxed{N_{DBPS}}, & \text{if } a_{init} = 4 \end{cases} \longleftarrow vNdbps \quad (27\text{-}62)$$
$$\phantom{xxxxxxxxxxxxxxxxxxxxxxxxxxxxxxxxxxxxxxxxx}505$$

$$N_{CBPS, last, init} = \begin{cases} a_{init} N_{CBPS, SHORT}, & \text{if } a_{init} < 4 \\ \boxed{N_{CBPS}}, & \text{if } a_{init} = 4 \end{cases}$$
$$\phantom{xxxxxxxxxxxxxxx}\searrow vNcbps$$
$$\phantom{xxxxxxxxxxxxxxxx}510$$

$$N_{PAD, Pre\text{-}FEC} = (N_{SYM, init} - m_{STBC}) N_{DBPS} + m_{STBC} N_{DBPS, last, init} \quad (27\text{-}63)$$
$$\phantom{xxxxxxxxxxxx} - 8 \cdot \text{APEP\_LENGTH} - N_{Tail} - N_{service}$$

$$N_{SYM, init} = m_{STBC} \cdot \left\lceil \dfrac{8 \cdot \text{APEP\_LENGTH} + N_{Tail} + N_{service}}{m_{STBC} \boxed{N_{DBPS}}} \right\rceil \quad (27\text{-}64)$$
$$\phantom{xxxxxxxxxxxxxxxxxxxxxxxxxxxxxxxxxxxxx}\swarrow$$
$$\phantom{xxxxxxxxxxxxxxxxxxxxxxxxxxxxxxxxx}vNdbps$$
$$\phantom{xxxxxxxxxxxxxxxxxxxxxxxxxxxxxxxxxxx}505$$

FIG. 5

$$N_{PAD,Post\text{-}FEC} = \boxed{N_{CBPS}} - N_{CBPS,last} \tag{27-75}$$

↖ vNcbps
800 ↘
805

$$N_{DBPS,last,init,u} = \begin{cases} a_{init} N_{DBPS,short,u} & \text{if } a_{init} < 4 \\ \boxed{N_{DBPS,u}} & \text{if } a_{init} = 4 \end{cases} \leftarrow vNdbps,u \atop 905 \qquad (27\text{-}78)$$

$$N_{CBPS,last,init,u} = \begin{cases} a_{init} N_{CBPS,short,u} & \text{if } a_{init} < 4 \\ \boxed{N_{CBPS,u}} & \text{if } a_{init} = 4 \end{cases}$$

$vNcbps,u$
910

$$N_{PAD,Pre\text{-}FEC,u} = (N_{SYM,init} - m_{STBC}) \boxed{N_{DBPS,u}} + m_{STBC} N_{DBPS,last,init,u} \qquad (27\text{-}79)$$
$$- 8 \cdot APEP\_LENGTH_u - N_{service}$$

$vNdbps,u$ 905
$vNdbps,u$ 905

$$N_{pld,u} = (N_{SYM,init} - m_{STBC}) \boxed{N_{DBPS,u}} + m_{STBC} N_{DBPS,last,init,u} \qquad (27\text{-}80)$$

$$N_{avbits,u} = (N_{SYM,init} - m_{STBC}) \boxed{N_{CBPS,u}} + m_{STBC} N_{CBPS,last,init,u} \qquad (27\text{-}81)$$

$vNcbps,u$ 910

$$N_{avbits,u} = \begin{cases} N_{avbits,u} + m_{STBC} \cdot \boxed{N_{CBPS,u}} - 3 N_{CBPS,short,u}, & \text{if } a_{init} = 3 \\ N_{avbits,u} + m_{STBC} \cdot N_{CBPS,short,u} & \text{otherwise} \end{cases} \qquad (27\text{-}82)$$

$$N_{DBPS,last,u} = \begin{cases} a \cdot N_{DBPS,short,u} & \text{if } a < 4 \\ \boxed{N_{DBPS,u}} & \text{if } a = 4 \end{cases} \leftarrow vNdbps,u \atop 905 \qquad (27\text{-}86)$$

$$N_{CBPS,last,u} = \begin{cases} a \cdot N_{CBPS,short,u} & \text{if } a < 4 \\ \boxed{N_{CBPS,u}} & \text{if } a = 4 \end{cases}$$

$vNcbps,u$ 910

$$N_{PAD,Pre\text{-}FEC,u} = (N_{SYM} - m_{STBC}) \boxed{N_{DBPS,u}} + m_{STBC} N_{DBPS,last,u} \qquad (27\text{-}87)$$
$$- 8 \cdot APEP\_LENGTH_u - N_{tail} - N_{service}$$

$vNdbps,u$
905

$$N_{PAD,Post\text{-}FEC,u} = \boxed{N_{CBPS,u}} - N_{CBPS,last,u} \qquad (27\text{-}88)$$

$vNcbps,u$
910

FIG. 9

- PSDU_LENGTH in PLME-TXTIME.confirm:

$$\text{PSDU\_LENGTH}_u = \left\lfloor \frac{(N_{SYM} - m_{STBC}\boxed{N_{DBPS,u}} + m_{STBC}N_{DBPS,last,init,u} - N_{service} - N_{tail}}{8} \right\rfloor \quad (27\text{-}137)$$

$$\text{PSDU\_LENGTH}_u = \left\lfloor \frac{(N_{SYM,init} - m_{STBC}\boxed{N_{DBPS,u}} + m_{STBC}N_{DBPS,last,init,u} - N_{service}}{8} \right\rfloor \quad (27\text{-}138)$$

- PSDU_LENGTH in RXVECTOR for user-u:

$$\text{PSDU\_LENGTH}_u = \left\lfloor \frac{(N_{SYM,RX,u} - m_{STBC}\boxed{N_{DBPS,u}} + m_{STBC}N_{DBPS,last,RX,u} - N_{service} - N_{tail,u}}{8} \right\rfloor \quad (27\text{-}143)$$

vNdbps,u
1005

Table 27-15—Tone allocation related constants for RUs in an OFDMA HE PPDU

| Parameter | RU Size (tones) | | | | | | | Description |
|---|---|---|---|---|---|---|---|---|
| | 26 | 52 | 106 | 242 | 484 | 996 | 2×996 | |
| $N_{SD}$ | 24 | 48 | 102 | 234 | 468 | 980 | 1960 | Number of data subcarriers per RU |
| $N_{SP}$ | 2 | 4 | 4 | 8 | 16 | 16 | 32 | Number of pilot subcarriers per RU |
| $N_{ST}$ | 26 | 52 | 106 | 242 | 484 | 996 | 1992 | Total number of subcarriers per RU |
| NOTE: $N_{ST} = N_{SD} + N_{SP}$ | | | | | | | | |

1400

Table 27-32—$N_{SD,short}$ values

| RU Size | $N_{SD,short}$ | |
| --- | --- | --- |
| | DCM = 0 | DCM = 1 |
| 26-tone | 6 | 2 |
| 52-tone | 12 | 6 |
| 106-tone | 24 | 12 |
| 242-tone | 60 | 30 |
| 484-tone | 120 | 60 |
| 996-tone | 240 | 120 |
| 2×996-tone | 492 | 246 |

1500

Table 27-54—HE-MCSs for 26-tone RU, $N_{SS} = 1$

| HE-MCS Index | DCM | Modulation | R | $N_{BPSCS}$ | $N_{SD}$ | $N_{CBPS}$ | $N_{DBPS}$ | Data rate (Mb/s) | | |
|---|---|---|---|---|---|---|---|---|---|---|
| | | | | | | | | 0.8 μs GI | 1.6 μs GI | 3.2 μs GI |
| 0 | 1 | BPSK | 1/2 | 1 | 12 | 12 | 6 | 0.4 | 0.4 | 0.4 |
| | 0 | | 1/2 | | 24 | 24 | 12 | 0.9 | 0.8 | 0.8 |
| 1 | 1 | QPSK | 1/2 | 2 | 12 | 24 | 12 | 0.9 | 0.8 | 0.8 |
| | 0 | | 1/2 | | 24 | 48 | 24 | 1.8 | 1.7 | 1.5 |
| 2 | N/A | | 3/4 | | 24 | 48 | 36 | 2.6 | 2.5 | 2.3 |
| 3 | 1 | 16-QAM | 1/2 | 4 | 12 | 48 | 24 | 1.8 | 1.7 | 1.5 |
| | 0 | | 1/2 | | 24 | 96 | 48 | 3.5 | 3.3 | 3.0 |
| 4 | 1 | | 3/4 | | 12 | 48 | 36 | 2.6 | 2.5 | 2.3 |
| | 0 | | 3/4 | | 24 | 96 | 72 | 5.3 | 5.0 | 4.5 |

VIRTUAL RESOURCE UNIT FOR MULTI-RESOURCE UNIT ASSIGNMENT TO A SINGLE STATION IN WLAN

CROSS-REFERENCE TO RELATED APPLICATIONS

This application claims the benefit of and priority to provisional patent application Ser. No. 62/856,251, with filing date Jun. 3, 2019, by Shengquan Hu, et al., which is hereby incorporated by reference in its entirety.

FIELD

Embodiments of the present invention generally relate to the field of wireless communications. More specifically, embodiments of the present invention relate to systems and methods for using multiple resource units with a single wireless station within a wireless communication network.

BACKGROUND

Existing approaches to WLAN wireless communication involve tone plans used to map complex constellation points of codewords to nonadjacent addresses or index values. Interleaving the codeword mapping is important to reduce the error rate of wireless transmissions, for example, caused by burst errors. This type of mapping in effect spreads the data out over frequencies to make channel errors more correctable via error correction algorithms. Existing tone plans typically define resource units including a number of data tones ($N_{SD}$) that can be assigned to specific users/clients. The size of the channel's resource units depends on the channel's bandwidth and tone spacing. The bands currently available for 5 GHz transmissions are 20 MHz, 40 MHz, 80 MHz, and 160 MHz. Typically assigning narrower channel bandwidths per user can support a greater number of users/clients, where wider channel bandwidths can provide greater throughput.

Preamble puncturing can be used to avoid interference at certain frequencies that are otherwise available to a wireless network. For example, in some cases it is useful to "puncture" a hole or gap in the middle of a spectrum segment to avoid interference caused by radar. When a radar signal is detected, it is possible to puncture a 20 MHz segment that is used by radar out of an 80 MHz segment (resource unit), for example, thereby creating a 20 MHz segment and a 40 MHz segment on either side of the punctured portion. Under the existing protocols of IEEE 802.11ax, the 20 MHz segment and the 40 MHz segment can be treated as separate resource units and assigned to different wireless users/devices. However, it is not possible to assign both resource units to the same wireless user/device under the existing approach.

SUMMARY

Accordingly, what is needed is an approach to wireless transmissions that can assign multiple resource units (RUs) to a single wireless station (STA) to utilize the available spectrum more efficiently, enhanced spectral efficiency and network throughput when preamble puncturing is used, and achieve frequency diversity to improve the overall link quality. Embodiments of the present invention can assign multiple resource units (RUs) to a single wireless station using an aggregated Multi-RU ("virtual resource unit" or "vRU") that aggregates multiple RUs, and the parameters of the virtual RU can be calculated according to existing standards such the padding schemes and RUs (e.g., RU26, RU52, RU106, RU242, RU484, RU996, RU2x996) as defined in IEEE 802.11ax. The Virtual RU associated parameters used for joint encoding can be directly calculated based on formulas described herein according to embodiments of the present invention and/or using pre-defined tables in certain implementations.

Embodiments of the present invention can perform independent encoding for each RU aggregated in the virtual RU, for joint encoding across multiple RUs, or for a mixed transmission scheme that allocates RUs into multiple groups that can be jointly encoded. The associated parameters for the Virtual RU are used for both the transmitter and receiver sides of the joint encoding process. Virtual RU based joint encoding methodology can be easily extended for general RU aggregations for any size of RU, and any number of RUs in the Multi-RU aggregations. Furthermore, this virtual RU-based methodology can be also extended to the unequal MCS or unequal number of spatial streams on each RU for the Multi-RU aggregation.

According to one embodiment, a method of transmitting data to a wireless station (STA) using a virtual resource unit (RU) assigned to the wireless STA is disclosed. The method includes calculating parameters for transmitting the virtual RU according to a multi-RU scheduling, where said virtual RU includes a plurality of RUs of the multi-RU scheduling, performing pre-FEC padding, FEC encoding, and post-FEC padding on the virtual RU according to the parameters, and transmitting data to the wireless STA using the virtual RU.

According to some embodiments, performing pre-FEC padding includes performing pre-FEC padding using a vNdbps value including a sum of Ndbps values of the RUs of the virtual RU, a vNcbps value including a sum of Ncbps values of the RUs of the virtual RU, and a vNsd,short value including a sum of Nsd,short values of the RUs of the virtual RU.

According to some embodiments, the performing post-FEC padding includes performing post-FEC padding using a vNcbps value, and where the vNcbps value includes a sum of Ncbps values of the RUs of the virtual RU.

According to some embodiments, the plurality of RUs of the virtual RU include adjacent physical RUs.

According to some embodiments, the plurality of RUs of the virtual RU include non-adjacent physical RUs.

According to some embodiments, the method includes determining RU parameters according to tables defined in IEEE 802.11ax, and calculating parameters for transmitting the virtual RU includes calculating parameters using the RU parameters according to the tables.

According to some embodiments, the pre-FEC padding includes performing pre-FEC MAC padding and pre-FEC PHY padding.

According to some embodiments, the method includes performing LDPC or BCC encoding on the virtual RU.

According to some embodiments, the method further includes passing the encoded data to a stream parser, a segment parser, BCC interleaver, a constellation mapper, and an LDPC tone mapper for transmission.

According to some embodiments, the plurality of RUs of the virtual RU is passed to different segment parsers, different constellation mappers, and different LDPC tone mappers.

According to another embodiment, a wireless communication device is disclosed. The wireless communication device includes a processor, and a memory coupled to the processor and including instructions executed by the processor to perform a method of transmitting data to a wireless station (STA) using a virtual resource unit (RU) assigned to the wireless STA. The method includes calculating parameters for transmitting the virtual RU according to a multi-RU scheduling, where said virtual RU includes a plurality of RUs of the multi-RU scheduling, performing pre-FEC padding, FEC encoding, and post-FEC padding on the virtual RU according to the parameters, and transmitting data to the wireless STA using the virtual RU.

According to a different embodiment, a non-transitory computer-readable storage medium having embedded therein program instructions, which when executed by one or more processors of a device, causes the device to execute a process for transmitting data to a wireless station (STA) using a virtual resource unit (RU) assigned to the wireless STA. The process includes calculating parameters for transmitting the virtual RU according to a multi-RU scheduling, where said virtual RU includes a plurality of RUs of the multi-RU scheduling, performing pre-FEC padding, FEC encoding, and post-FEC padding on the virtual RU according to the parameters, and transmitting data to the wireless STA using the virtual RU.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a block diagram of an exemplary calculation for determining pre-FEC padding values for a virtual RU assigned to a single user depicted according to embodiments of the present invention.

FIG. 8 is a diagram of an exemplary calculation for determining post-FEC padding values for a virtual RU assigned to a single user depicted according to embodiments of the present invention.

FIG. 9 is a diagram of an exemplary calculation for performing HE-MU transmission of a virtual RU assigned to a single user depicted according to embodiments of the present invention.

FIG. 10 is a diagram of calculations for calculating PSDU length values for transmitting a virtual RU assigned to a single user depicted according to embodiments of the present invention.

DETAILED DESCRIPTION

Figure 1:
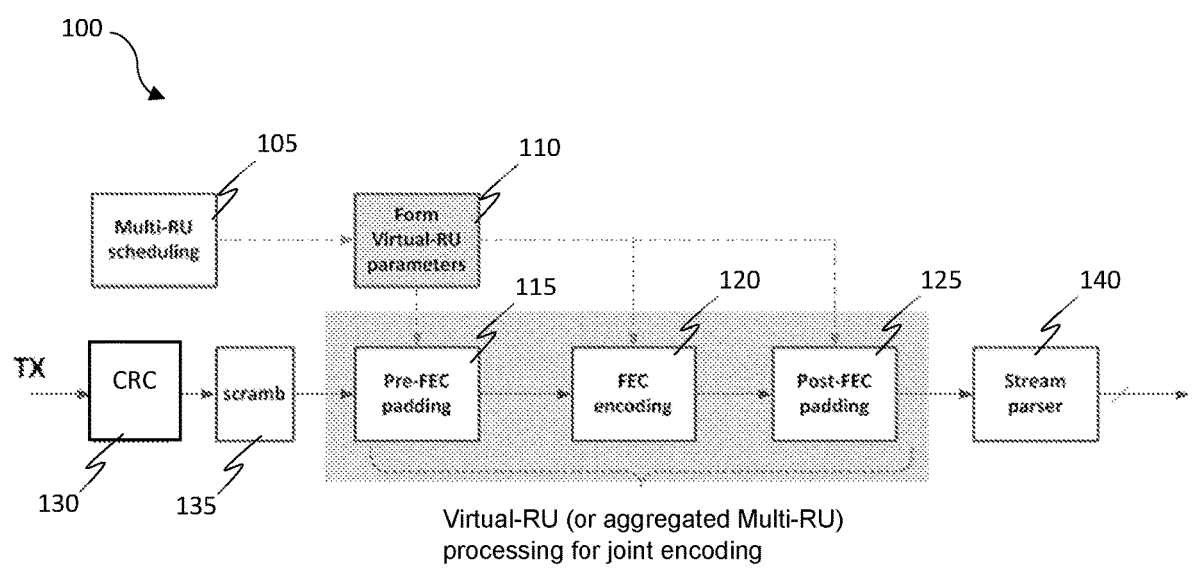
FIG. 1 is a block diagram of an exemplary joint encoding process for processing a virtual RU depicted according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follow are presented and discussed in terms of a method. Although steps and sequencing thereof are disclosed in a figure herein (e.g., FIG. 11) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "configuring," "coordinating," "storing," "transmitting," "authenticating," "identifying," "requesting," "reporting," "determining," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

VIRTUAL RESOURCE UNIT FOR MULTI-RESOURCE UNIT ASSIGNMENT TO A SINGLE STATION IN WLAN

As used herein, the term "EHT" may refer generally to a recent generation of wireless communication (Wi-Fi) known as Extremely High Throughput (EHT) and is defined according to the IEEE 802.11be standards. The term station (STA) refers generally to an electronic device capable of sending and receiving data over Wi-Fi that is not operating as an access point (AP).

Embodiments of the present invention assign multiple resource units (RUs) to a single wireless station using an aggregated Multi-RU ("virtual resource unit" or "vRU") that aggregates multiple RUs, and the parameters of the virtual RU can be calculated according to existing standards such the padding schemes and RUs (e.g., RU26, RU52, RU106, RU242, RU484, RU996, RU2x996) as defined in IEEE 802.11ax. The virtual RU parameters used for joint encoding can be directly calculated based on formulas described herein according to embodiments of the present invention, and according to values obtained from pre-defined tables.

Embodiments of the present invention can perform independent encoding for each RU aggregated in the virtual RU, joint encoding across multiple RUs, or a mixed transmission scheme that allocates RUs into multiple groups that can be jointly encoded. The associated parameters for the Virtual RU are used for both the transmitter and receiver sides of the joint encoding process. The virtual RU based joint encoding methodology can be readily extended for general RU aggregations for any size of RU, and any number of RUs in the Multi-RU aggregations. Furthermore, this virtual RU based methodology can be also extended to the unequal MCS or unequal number of spatial streams on each RU for the Multi-RU aggregation.

The virtual RU joint encoding process can be used for SU (Single User), DL MU (Multiple Users) of OFDMA, MU-MIMO, UL TB (Trigger Based) PPDU, or a combination thereof. To avoid added processing complexity, rather than introducing an additional binary convolutionally encoding (BCC) interleaver or low-density parity-check (LDPC) tone mapper, embodiments of the present invention provide a virtual RU transmission scheme for aggregating multiple RUs for assignment to a single wireless STA to advantageously simplify multi-RU transmission processing.

According to some embodiments, the virtual RU transmission schemes described herein are performed according to IEEE 802.11be standards. For example, according to IEEE 802.11be standards: more than one RUs can be assigned to a single STA; each PSDU transmitted uses one encoder for LDPC; a single tone mapper is used for LDPC for combined RUs within one 80 MHz segment; and there is only one PSDU transmitted per STA over each link.

With regard to FIG. 1, a block diagram of an exemplary joint encoding process and transmission scheme 100 for processing a virtual RU is depicted according to embodiments of the present invention. The virtual RUs described herein include any combination of two or more "physical RUs," such as the RUs defined in IEE 802.11ax (e.g., RU26, RU52, RU106, RU242, RU484, RU996, RU2x996). A virtual RU can include a combination of adjacent or non-adjacent physical RUs, and the packet length and padding schemes for transmitting the virtual RU are calculated using joint encoding over multiple physical RUs to a single wireless STA. At step 105, multi-RU scheduling is performed to assign RUs to a user or users (e.g., wireless STAs). At step 110, virtual RU parameters are determined and used for a joint encoding process including Pre-Forward Error Correction (FEC) padding 115, FEC encoding 120, and Post-FEC padding 125. The parameters for performing the padding and FEC encoding can be determined according to pre-defined tables. The FEC encoding 120 can include using Low-Density Parity Check (LDPC) or Binary Convolutional Code (BCC), for example. The transmission scheme of the virtual RUs includes performing a Cyclic Redundancy Check (CRC) error-detecting function 130 and scramble sequence generator 135. The encoded virtual RU is sent to a stream parser 140 that divides the outputs of the joint encoding process into blocks of bits and sends the blocks to different interleaves for transmission.

Figure 2:
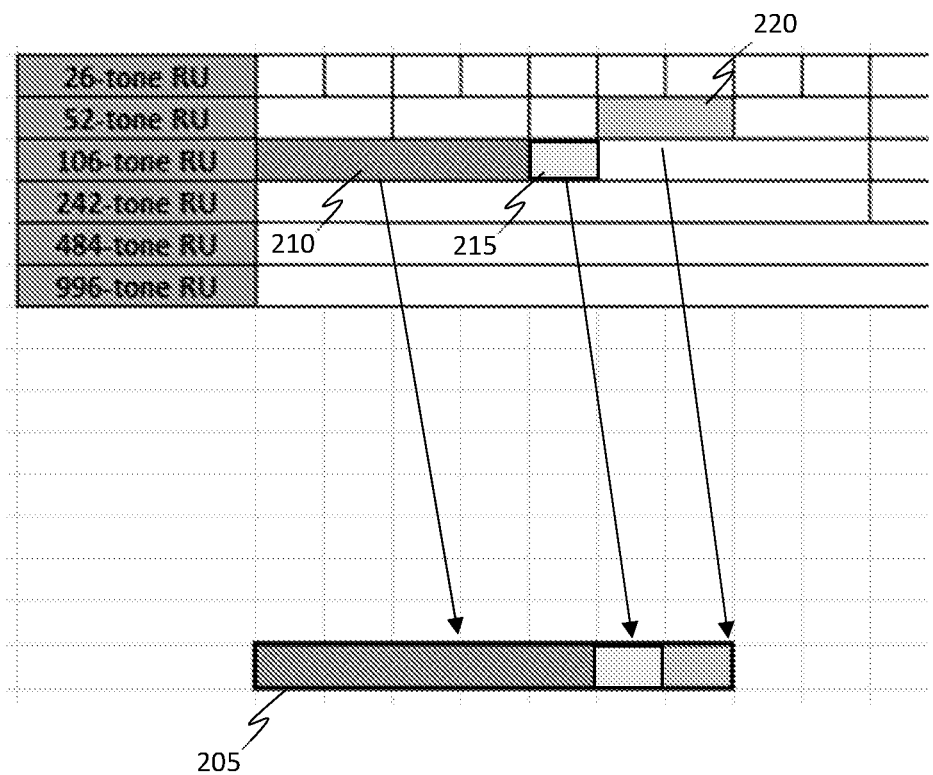
FIG. 2 is a block diagram of an exemplary virtual RU including adjacent physical RUs depicted according to embodiments of the present invention.

With regard to FIG. 2, a block diagram of an exemplary virtual RU 205 is depicted according to embodiments of the present invention. Virtual RU 205 includes three adjacent physical RUs RU106 (210), RU26 (215), and RU52 (220) that are aggregated together in virtual RU 205. As depicted in FIG. 2, virtual RU 210 is a 184-tone RU. Virtual UR 205 can be encoded and transmitted using the exemplary scheme depicted in FIG. 1, for example, and can be assigned to a single user or wireless STA. According to some embodiments, the number of physical RUs aggregated in the virtual RU is determined based on the desired size (e.g., number of tones) of the virtual RU.

Figure 3:
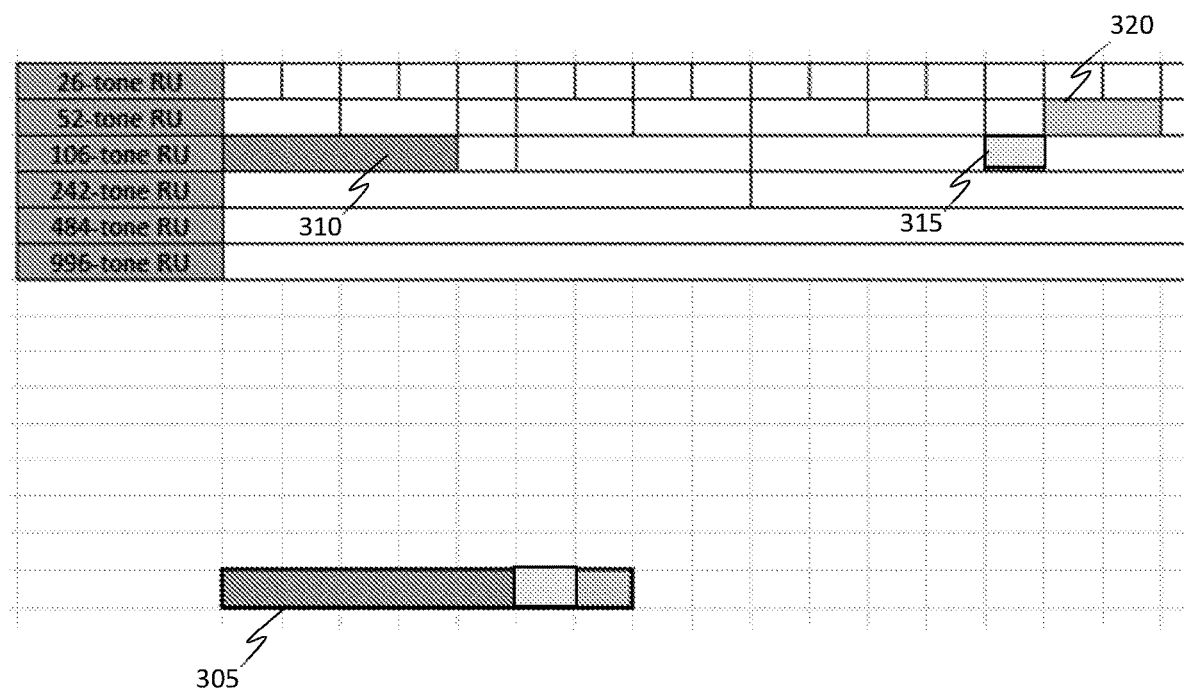
FIG. 3 is a block diagram of an exemplary virtual RU including non-adjacent physical RUs depicted according to embodiments of the present invention.

With regard to FIG. 3, a block diagram of an exemplary virtual RU 305 is depicted according to embodiments of the present invention. Virtual RU 305 includes three physical RUs RU106 (310), RU26 (315), and RU52 (320) that are aggregated together in virtual RU 305. RU106 (310) and RU26 (3125) are non-adjacent. As depicted in FIG. 3, virtual RU 210 is a 184-tone RU. Virtual RU 205 including adjacent RUs (FIG. 2) and virtual RU 305 including non-adjacent RUs can be encoded/processed (e.g., pre-FEC padding, BCC/LDPC encoding, etc.) in the same way same as long as the sizes of the virtual RUs 205 and 305 are the same (e.g., 184 tones). Virtual UR 205 can be encoded and transmitted using the exemplary scheme depicted in FIG. 1, for example, and can be assigned to a single user or wireless STA.

Figure 4:
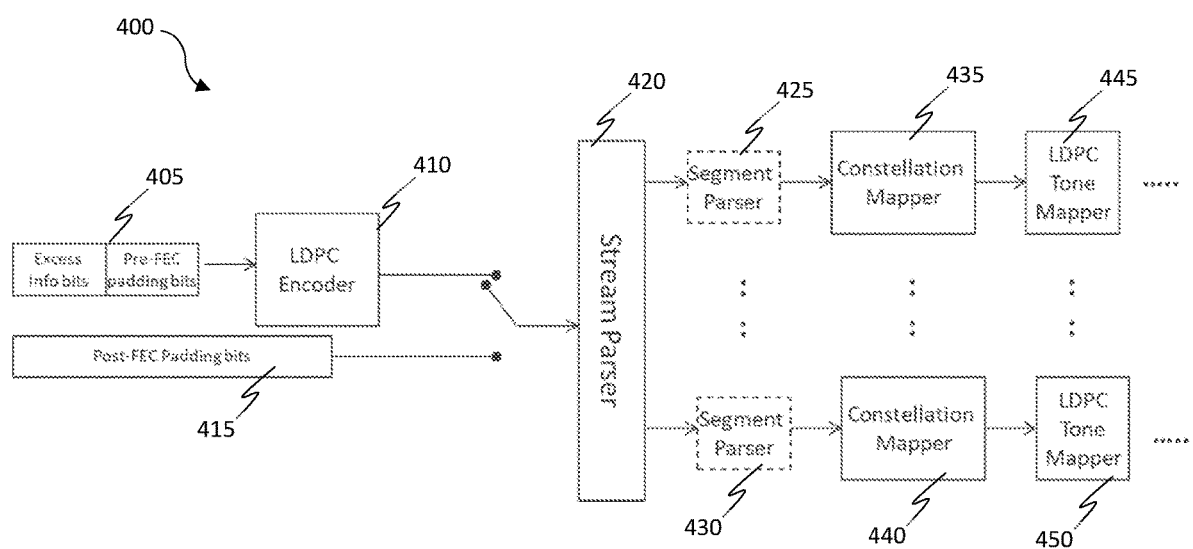
FIG. 4 is a block diagram of an exemplary padding scheme for transmission of a virtual RU to a single user/ wireless STA depicted according to embodiments of the present invention.

With regard to FIG. 4, an exemplary padding scheme 400 for transmission of a virtual RU to a single user/wireless STA is depicted according to embodiments of the present invention. The IEEE 802.11ax standard defines padding schemes for transmissions of a single physical RU for each user. Accordingly, a modified padding scheme is described herein according to embodiments of the present invention that includes a two-step padding process applied to an HE PPDU. The pre-FEC padding process includes both pre-FEC for both the Medium Access Control (MAC) layer (pre-FEC MAC padding) and pre-FEC for the Physical (PHY) layer (pre-FEC PHY padding), and is applied before FEC coding. A post-FEC PHY padding process is applied on the FEC encoded bits. In this way, the existing IEEE 802.11ax padding schemes can be lightly modified and re-used for transmitting virtual RUs. As depicted in FIG. 4, exemplary padding scheme 400 includes an LDPC Encoder 410 that receives pre-FEC padding bits and excess info bits 405. The output of LDPC Encoder 410 and the post-FEC bits 415 are passed to stream parser 420 that divides the outputs of the LDPC encoding process into blocks of bits. The blocks are passed to a series of segment parsers (e.g., segment parsers 425 and 430), constellation mappers (e.g., segment parsers 435 and 440) and LDPC Tone Mappers (e.g., LDPC tone mappers 445 and 450) for transmitting the virtual RU to a single user.

As mentioned above, the parameters of a virtual RU can be calculated according to existing standards such the padding schemes and RUs (e.g., RU26, RU52, RU106, RU242, RU484, RU996, RU2x996) defined in IEEE 802.11ax. The Virtual RU associated parameters used for joint encoding can be directly calculated based on formulas described herein according to embodiments of the present invention with reference to pre-defined tables. Table I below includes parameters defined for virtual RUs (vRUs) based on standards defined in IEEE 802.11ax. Each vRU parameter is associated with a specific table or tables as defined according to IEEE 802.11ax standards (see, IEEE P802.11ax/D4.0, February 2019). Tables 27-15, 27-32, and 27-54 published in IEEE P802.11ax/D4.0, February 2019 are partially reproduced below and are referred to in the exemplary vRU parameter calculations described with reference to FIGS. 5-10. Table I below lists several formulas used to compute parameters for transmitting a vRU assigned to a single user.

TABLE I

| | |
|---|---|
| $vN_{sd} = \sum_{r}^{Nru} N_{sd,r}$ | Nsd, r look-up in Table 27-14 & Table 27-15 |
| $vN_{dbps} = \sum_{r}^{Nru} N_{dbps,r}$ | Nsd, r look-up in Table 27-54 to 27-109 |
| $vN_{cbps} = \sum_{r}^{Nru} N_{cbps,r}$ | Nsd, r look-up in Table 27-54 to 27-109 |
| $vN_{sd,short} = \sum_{r}^{Nru} N_{sd,short,r}$ | Nsd, short, r look-up in Table 27-32 |

Figure 13:
FIG. 13 is a table of exemplary tone allocation related constants for RUs in an OFDMA HE PPDU according to embodiments of the present invention.
Figure 14:
FIG. 14 is a table of exemplary $N_{SD,short}$ values according to embodiments of the present invention.

To calculate parameters for an exemplary 184-tone vRU including, for example, an RU106, RU26, and RU52, table 1300 of FIG. 13 and table 1400 of FIG. 14 are referenced. It is assumed that the values MCS=4, Nss=1, and DCM=0 are pre-set for the vRU. vNsd representing the number of sub carriers for data (data tones) available per RU is calculated using table 1300 of FIG. 13:

Table 1300 of FIG. 13 indicates that the number of data subcarriers per RU (Nsd) for a RU size of 106 tones is 102, 48 for an RU size of 52 tones, and 24 for an RU size of 26. Therefore, the number of data subcarriers per vRU (vNsd) is calculated as: vNsd=102+48+24 =174 tones.

Table 1400 of FIG. 14 indicates the number of data tone subcarriers used for padding (vNsd,short) depending on RU size for configurations where DCM=0 and DCM=1. Embodiments of the present invention assume that DCM is set to zero. Therefore, the vNsd, short is calculated as: vNsd,short=24+6+12=42 tones.

Figure 15:
FIG. 15 is a table of HE-MCSs for 26-tone RUs according to embodiments of the present invention.

Table 27-54 (see Table 1500 of FIG. 15) lists the number of data bits per OFDM symbol (Ndbps) and the number of coded bits per symbol (Ncbps) for a 26 tone RU assuming MCS=4 and NSS=1. Similarly, Table 27-62 and 27-70 list the Ndbps and Ncbps values for 52 tone RUs and 106 tone RUs, respectively. The vNdbps and vNcbps values can be determined by adding the respective values from the tables. For example, Table 27-54 indicates that the Ndbps value for a 26-tone RU is 72 tones, and the Ncbps value for a 26-tone RU is 96 tones. The Ndbps and Ncbps values for the 52 tone RUs and 106 tone RUs can similarly be looked up in tables 27-62 and 27-70, respectively. Table 27-62 indicate that the Ndbps value for a 52 tone RU is 144, and the Ncbps value for a 52 tone RU is 192. Table 27-70 indicates that the Ndbps value for a 106 tone RU is 306, and the Ncbps value for a 106 tone RU is 408. Accordingly, the vNdps value for a virtual RU including an RU26, RU52, and an RU106 is calculated as: vNdbps=72+144+306=522, and the vNcbps value is calculated as: vNcbps=96+192+408=696.

According to embodiments of the present invention, the values obtained from the tables described above can be used to calculate parameters for virtual RU transmission, including pre-FEC padding, BCC encoding, LPDC encoding, and post-FEC padding, among other uses. FIGS. 5-10 illustrate exemplary calculations for determining parameters of vRUs assigned to a single user according to embodiments of the present invention.

With regard to FIG. 5, steps in an exemplary calculation 500 for determining pre-FEC padding values for a vRU assigned to a single user are depicted according to embodiments of the present invention. Calculation 500 is performed using a vNdbps value 505 in place of Ndbps, a vNcbps value 510 in place of Ncbps, and a vNsd,short value 515 in place of the Nsd,short, value typically used in this calculation according to IEEE 802.11ax. The vNdbps, vNcbps, and vNsd,short, values can be calculated as described above according to embodiments of the present invention.

Figure 6:
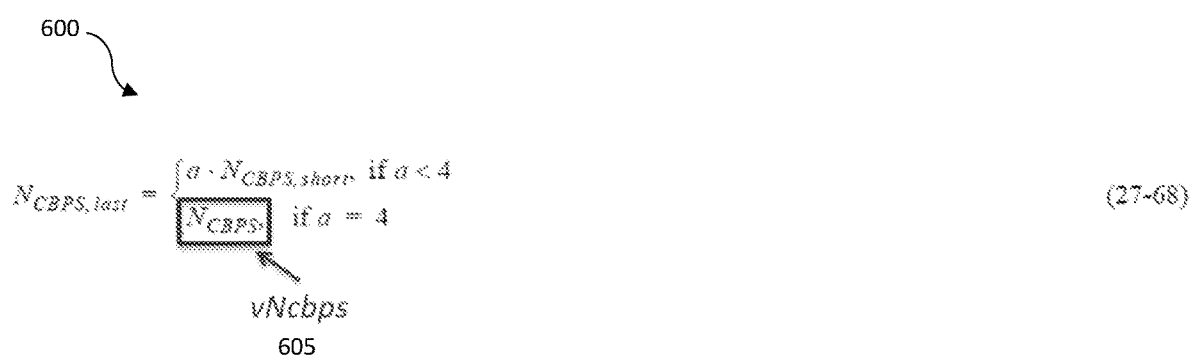
FIG. 6 is a diagram of an exemplary calculation for determining BCC encoding values for a virtual RU assigned to a single user is depicted according to embodiments of the present invention.

With regard to FIG. 6, steps in an exemplary calculation 600 for determining BCC encoding values for a vRU assigned to a single user is depicted according to embodiments of the present invention. To perform BCC encoding, the value of Ncbps,last is determined according to the standards defined in IEEE 802.11ax using a vNcbps value 605 in place of the Ncbps value typically used in the calculation.

Figure 7:
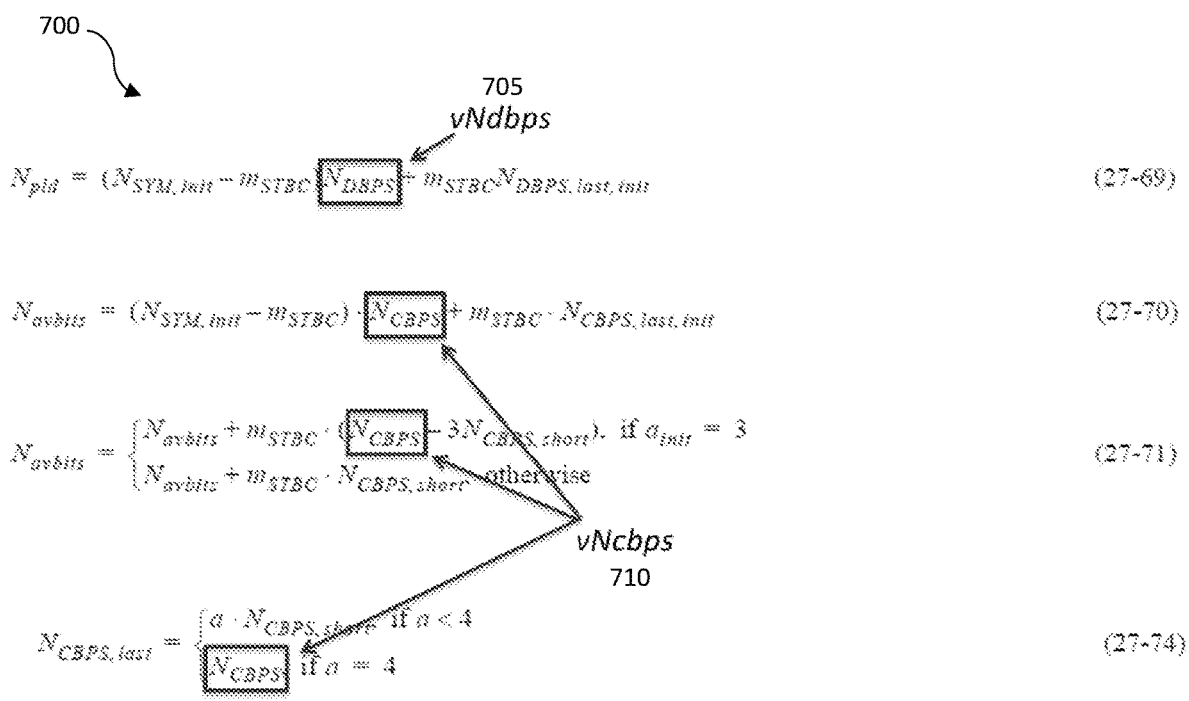
FIG. 7 is a diagram of an exemplary calculation for determining LDPC encoding values for a virtual RU assigned to a single user depicted according to embodiments of the present invention.

With regard to FIG. 7, steps in an exemplary calculation 700 for determining LDPC encoding values for a vRU assigned to a single user are depicted according to embodiments of the present invention. Calculation 700 is performed using a vNdbps value 705 in place of Ndbps and a vNcbps value 710 in place of the Ncbps value typically used in this calculation according to IEEE 802.11ax. The vNdbps and vNcbps values can be calculated as described above according to embodiments of the present invention.

With regard to FIG. 8, an exemplary calculation 800 for determining post-FEC padding values for a vRU assigned to a single user is depicted according to embodiments of the present invention. To perform BCC encoding, the value of Npad,post-FEC is determined according to the standards defined in IEEE 802.11ax using a vNcbps value 805 in place of the Ncbps value typically used in the calculation.

With regard to FIG. 9, steps in an exemplary calculation 900 for performing HE-MU Transmission of a vRU assigned to a single user are depicted according to embodiments of the present invention. When a single wireless STA is assigned a virtual RU transmitted in an HE-MU format, the vRU parameters for the u-th STA which is assigned the virtual RU are denoted as vNsd,u, vNdbps,u, vNcbps,u and vNsd,short,u. Calculation 900 is performed using a vNdbps,u value 905 in place of Ndbps and a vNcbps,u value 910 in place of the Ncbps value typically used in this calculation according to IEEE 802.11ax. The vNdbps,u and vNcbps,u, values are associated with a specific user/wireless STA (e.g., the u-th user) and can be calculated as described above according to embodiments of the present invention.

With regard to FIG. 10, calculations 1000 and 1050 for calculating PSDU length values for transmitting a vRU assigned to a single user are depicted according to embodiments of the present invention. Calculation 1000 is used to determine a PSDU length in a PLME-TXTIME.confirm primitive, and calculation 1050 is sued to determine a PSDU length in an RXVECTOR for user u. In equations 1000 and 1050, the vNdbps,u value 1005 is used in place of the Ndbps,u value typically used in these equations as defined in the IEEE 802.11ax standard.

Figure 11:
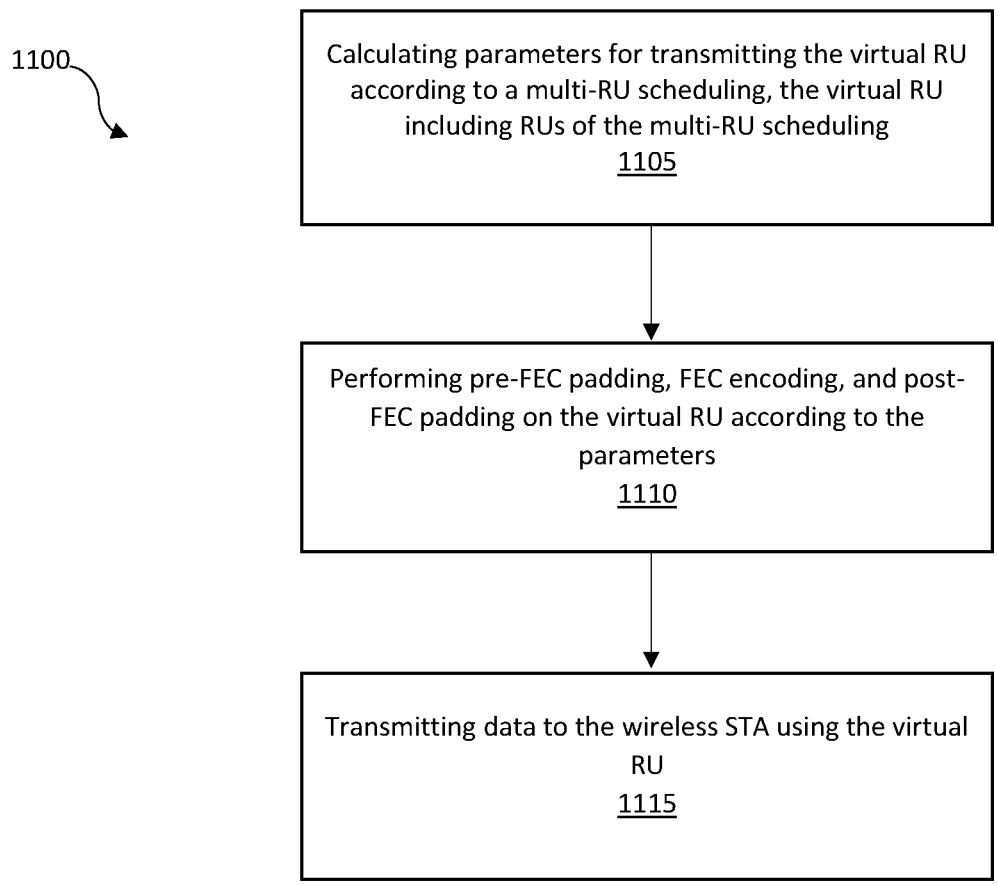
FIG. 11 is a flowchart of an exemplary sequence of computer implemented steps for transmitting data to a wireless STA using a virtual RU assigned to the wireless STA depicted according to embodiments of the present invention.

With regard to FIG. 11, an exemplary sequence of computer implemented steps for process 1100 of transmitting data to a wireless STA using a virtual RU assigned to the wireless STA are depicted according to embodiments of the present invention. The virtual RU includes multiple RUs that are assigned to the wireless STA, and the virtual RU can be assigned to the wireless STA via an RU scheduling process. At step 1105, parameters for transmitting the virtual RU according to a multi-RU scheduling are calculated. The calculations can be performed using new parameters, such as vNdbps, vNcdps, vNsd,short, etc., in place of the typical values defined in IEEE 802.11ax. The new parameters can represent a sum of RU parameters associated with the RUs aggregated in the virtual RU. Moreover, according to some embodiments, the RU parameters associated with the RUs aggregated in the virtual RU are determined using a look-up table defined in IEEE 802.11ax.

At step 1110, pre-FEC padding, FEC encoding, and post-FEC padding on the virtual RU are performed according to the parameters calculated in step 1105. Step 1105 can include performing pre-FEC padding comprises performing pre-FEC MAC padding and pre-FEC PHY padding, according to some embodiments. Moreover, step 1110 can include performing LDPC encoding on the virtual RU. According to some embodiments, the LDPC encoded data is passed to a stream parser, a segment parser, a constellation mapper, and an LDPC tone mapper for transmission.

At step 1115, data is transmitted to the wireless STA using the virtual RU. According to some embodiments, the virtual RU may be transmitted in an HE PPDU, for example.

EXEMPLARY COMPUTER CONTROLLED SYSTEM

Embodiments of the present invention are drawn to electronic systems for transmitting data using a virtual resource unit assigned to a single user/wireless STA. The following discussion describes one such exemplary electronic system or computer system that can be used as a platform for implementing embodiments of the present invention. The exemplary computer system 1212 can be a wireless access point or a wireless station, for example.

Figure 12:
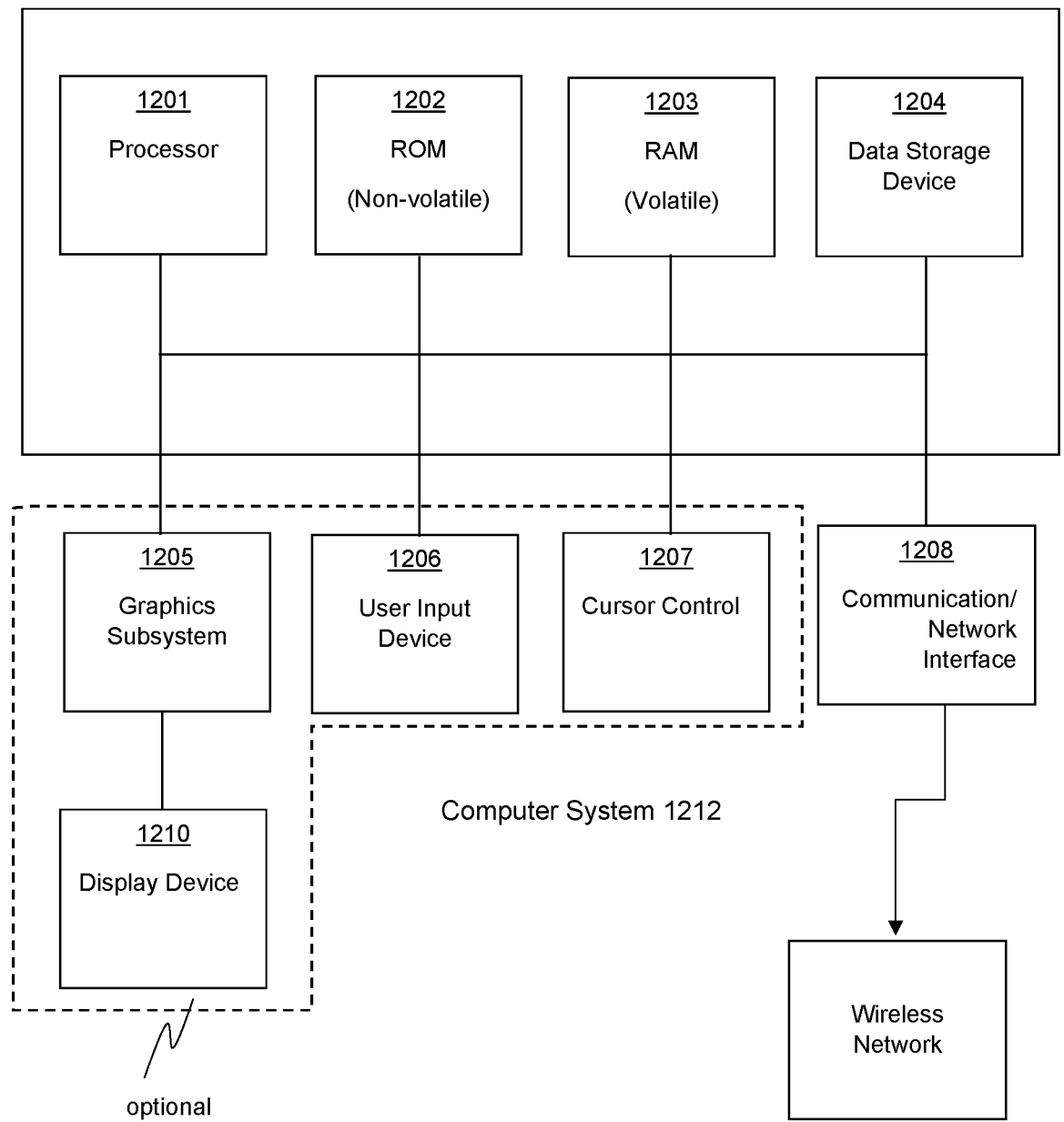
FIG. 12 is a block diagram depicting an exemplary computer system platform upon which embodiments of the present invention may be implemented.

In the example of FIG. 12, the exemplary computer system or wireless device includes a central processing unit (such as a processor or a CPU) 1201 for running software applications and optionally an operating system. Read-only memory 1202 and random access memory 1203 store applications and data for use by the CPU 1201. Data storage device 1204 provides non-volatile storage for applications and data and may include fixed disk drives, removable disk drives, flash memory devices, and CD-ROM, DVD-ROM or other optical storage devices. The optional user inputs 1206 and 1207 comprise devices that communicate inputs from one or more users to the computer system 1212 (e.g., mice, joysticks, cameras, touch screens, and/or microphones).

A communication or network interface 1208 includes a plurality of transceivers and allows the computer system 1212 to communicate with other computer systems, networks, or devices via an electronic communications network, including wired and/or wireless communication and including an Intranet or the Internet (e.g., 802.11 wireless standard). According to embodiments of the present invention, the communication or network interface 1208 can operate multiple transceivers simultaneously. The communication or network interface 1208 and can include a dual band interface that can operate in multiple bands simultaneously, such as 2.4 GHz, 5 GHz, and/or 6 GHz.

The optional display device 1210 may be any device capable of displaying visual information in response to a signal from the computer system 1212 and may include a flat panel touch sensitive display, for example, and may be remotely disposed. The components of the computer system 1212, including the CPU 1201, memory 1202/1203, data storage 1204, user input devices 1206, and graphics subsystem 1205 may be coupled via one or more data buses.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Embodiments of the present invention are thus described. While the present invention has been described in particular embodiments, it should be appreciated that the present invention should not be construed as limited by such embodiments, but rather construed according to the following claims.

What is claimed is:

1. A method of transmitting data to a wireless station (STA) using a virtual resource unit (RU) assigned to the wireless STA, the method comprising:
    calculating parameters for transmitting the virtual RU according to a multi-RU scheduling, wherein said virtual RU comprises a plurality of RUs of the multi-RU scheduling;
    performing pre-FEC padding, FEC encoding, and post-FEC padding on the virtual RU according to the parameters; and
    transmitting data to the wireless STA using the virtual RU.

2. The method as described in claim 1, wherein the performing pre-FEC padding comprises performing pre-FEC padding using:
    a vNdbps value comprising a sum of Ndbps values of the RUs of the virtual RU;
    a vNcbps value comprising a sum of Ncbps values of the RUs of the virtual RU; and
    a vNsd,short value comprising a sum of Nsd,short values of the RUs of the virtual RU.

3. The method as described in claim 1, wherein the performing post-FEC padding comprises performing post-FEC padding using a vNcbps value, and wherein the vNcbps value comprises a sum of Ncbps values of the RUs of the virtual RU.

4. The method as described in claim 1, wherein the plurality of RUs of the virtual RU comprise adjacent physical RUs.

5. The method as described in claim 1, wherein the plurality of RUs of the virtual RU comprise non-adjacent physical RUs.

6. The method as described in claim 1, further comprising determining RU parameters according to tables defined in IEEE 802.11ax, and wherein the calculating parameters for transmitting the virtual RU comprises calculating parameters using the RU parameters according to the tables.

7. The method as described in claim 1, wherein the performing pre-FEC padding comprises performing pre-FEC MAC padding and pre-FEC PHY padding.

8. The method as described in claim 7, further comprising performing at least one of LDPC encoding and BCC encoding on the virtual RU to produce encoded data.

9. The method as described in claim 8, further comprising passing the LDPC encoded data to a stream parser, a segment parser, BCC interleaver, a constellation mapper, and an LDPC tone mapper for transmission.

10. The method as described in claim 9, wherein the plurality of RUs of the virtual RU are passed to different segment parsers, different constellation mappers, and different LDPC tone mappers.

11. A wireless communication device, comprising:
a processor; and
a memory coupled to the processor and comprising instructions executed by the processor to perform a method of transmitting data to a wireless station (STA) using a virtual resource unit (RU) assigned to the wireless STA, the method comprising:
calculating parameters for transmitting the virtual RU according to a multi-RU scheduling, wherein said virtual RU comprises a plurality of RUs of the multi-RU scheduling;
performing pre-FEC padding, FEC encoding, and post-FEC padding on the virtual RU according to the parameters; and
transmitting data to the wireless STA using the virtual RU.

12. The wireless communication device as described in claim 11, wherein the performing pre-FEC padding comprises performing pre-FEC padding using:
a vNdbps value comprising a sum of Ndbps values of the RUs of the virtual RU;
a vNcbps value comprising a sum of Ncbps values of the RUs of the virtual RU; and
a vNsd,short value comprising a sum of Nsd,short values of the RUs of the virtual RU.

13. The wireless communication device as described in claim 11, wherein the performing post-FEC padding comprises performing post-FEC padding using a vNcbps value, and wherein the vNcbps value comprises a sum of Ncbps values of the RUs of the virtual RU.

14. The wireless communication device as described in claim 11, wherein the plurality of RUs of the virtual RU comprise adjacent physical RUs.

15. The wireless communication device as described in claim 11, wherein the plurality of RUs of the virtual RU comprise non-adjacent physical RUs.

16. The wireless communication device as described in claim 11, wherein the method further comprises determining RU parameters according to tables defined in IEEE 802.11ax, and wherein the calculating parameters for transmitting the virtual RU comprises calculating parameters using the RU parameters according to the tables.

17. The wireless communication device as described in claim 11, wherein the performing pre-FEC padding comprises performing pre-FEC MAC padding and pre-FEC PHY padding.

18. The wireless communication device as described in claim 17, wherein the method further comprises performing at least one of LDPC encoding and BCC encoding on the virtual RU to produce encoded data.

19. The wireless communication device as described in claim 18, wherein the method further comprises passing the encoded data to a stream parser, a segment parser, a BCC interleaver, a constellation mapper, and an LDPC tone mapper for transmission.

20. A non-transitory computer-readable storage medium having embedded therein program instructions, which when executed by one or more processors of a device, causes the device to execute a method of transmitting data to a wireless station (STA) using a virtual resource unit (RU) assigned to the wireless STA, the method comprising:
calculating parameters for transmitting the virtual RU according to a multi-RU scheduling, wherein said virtual RU comprises a plurality of RUs of the multi-RU scheduling;
performing pre-FEC padding, FEC encoding, and post-FEC padding on the virtual RU according to the parameters; and
transmitting data to the wireless STA using the virtual RU.

* * * * *